US010928449B2

(12) United States Patent
Azam et al.

(10) Patent No.: US 10,928,449 B2
(45) Date of Patent: Feb. 23, 2021

(54) APPARATUS FOR MEMORY BUILT-IN SELF-TEST WITH ERROR DETECTION AND CORRECTION CODE AWARENESS

(71) Applicant: Intel Corporation, Santa Clara, CA (US)

(72) Inventors: Asad Azam, Folsom, CA (US); R Selvakumar Raja Gopal, Tapah (MY); Kaitlyn Chen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 16/370,993

(22) Filed: Mar. 30, 2019

(65) Prior Publication Data

US 2019/0227121 A1      Jul. 25, 2019

(51) Int. Cl.
*G01R 31/3187* (2006.01)
*G06F 11/07* (2006.01)
*G06F 11/10* (2006.01)
*G11C 29/00* (2006.01)

(52) U.S. Cl.
CPC ........ *G01R 31/3187* (2013.01); *G06F 11/073* (2013.01); *G06F 11/0766* (2013.01); *G06F 11/0793* (2013.01); *G06F 11/1044* (2013.01); *G06F 11/1048* (2013.01); *G11C 29/00* (2013.01)

(58) Field of Classification Search
CPC .................................................. G01R 31/3187
USPC .................................................. 714/730, 732
See application file for complete search history.

(56) References Cited

U.S. PATENT DOCUMENTS

| 6,553,513 | B1 * | 4/2003 | Swoboda ............ G06F 11/3656 714/25 |
| 2009/0116321 | A1 * | 5/2009 | Shirur .................... G11C 29/02 365/201 |
| 2013/0019130 | A1 * | 1/2013 | Hakhumyan .......... G11C 29/18 714/718 |

* cited by examiner

*Primary Examiner* — Fritz Alphonse
(74) *Attorney, Agent, or Firm* — Alliance IP, LLC (57) ABSTRACT

Technologies for built-in self-testing of a memory array using error detection and correction code knowledge include identifying data errors between pseudo random data written to the memory array and the data read back from the memory array and ignoring those data errors determined to be correctable. The data errors may be determined to be correctable if an error corrector circuit can correct those errors or if the number of errors per memory chuck is less than a number of errors correctable by the error correct circuit.

23 Claims, 4 Drawing Sheets

FIG. 1

| MODE | PATH SELECTION | | | |
|---|---|---|---|---|
| | A | B | C | D |
| 302 FUNCTIONAL MODE | 1 | 1 | 1 | X |
| 304 BIST WITH NO ERROR CORRECTION KNOWLEDGE | X | 2 | X | X |
| 306 BIST WITH ERROR CORRECTION KNOWLEDGE | 2 | 1 | 1 | X |
| 308 ERROR CHECK DIAGNOSTIC | 2 | X | 2 | 1 |
| 310 ERROR CHECK DIAGNOSTIC W/ERROR INJECTION | 2 | X | 2 | 2 |

APPARATUS FOR MEMORY BUILT-IN SELF-TEST WITH ERROR DETECTION AND CORRECTION CODE AWARENESS

BACKGROUND

Functional safety is an important consideration in many systems, especially complex, real-time systems such as those found in the automotive and industrial segments. In many such complex, real-time systems, stringent constraints are imposed on the system to ensure the system operates in a safe and reliable manner, even under stressed conditions. As such, functional safety attempts to ensure the proper operation of various components of the system during run time conditions.

One approach to functional safety for electrical components is the use of built-in self-test (BIST) circuitry. BIST circuitry is used in various electrical devices and components to check other circuitry for faults, typically during operation of the electrical device and/or component. For example, in the case of memory, BIST circuitry may be used to check the memory for any faults or bad memory regions. Such fault checking can be performed on demand, responsively, or periodically to ensure proper functioning of the memory. The BIST circuitry can detect latent faults of the memory or operational damage to the memory to reduce or avoided failures of the system at large. To do so, typical BIST memory circuitry is configured to write pseudo random data to the memory, read the same pseudo random data back from the memory, and detect any faults in the memory arrays based on any errors detected in the read data as compared to the written data.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Figure 1:
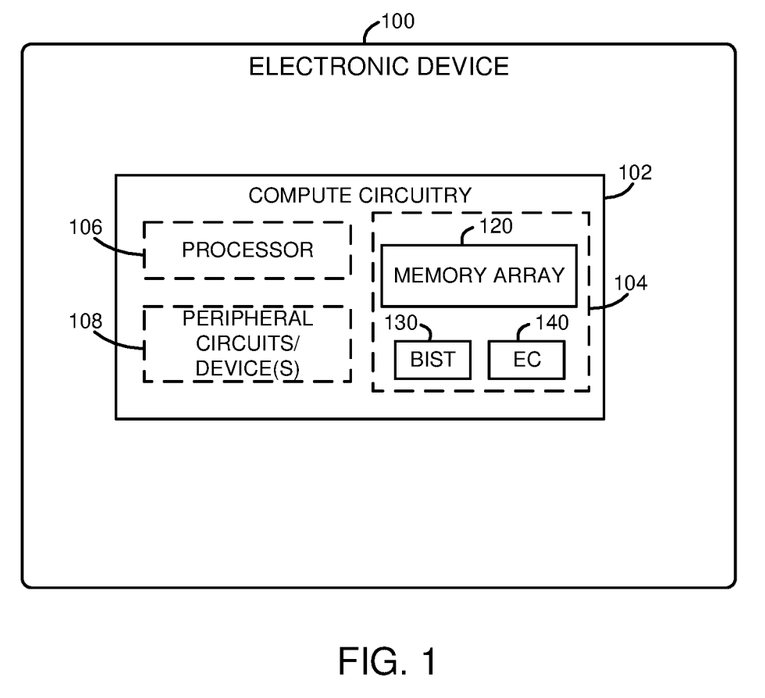
FIG. 1 is a simplified block diagram of at least one embodiment of an electronic device having a memory wrapper including a BIST circuit and memory.

Referring now to FIG. 1, an illustrative electronic device 100 includes compute circuitry 102 having a memory wrapper 104 configured to perform a self-test to validate proper operation as discussed in more detail below. The electronic device 100 may be embodied as any type of electrical device, component, or system for which functional safety is desired. That is, the electronic device 100 may be embodied as any type of device or component for which responsive or periodic validation of the proper operation of components of the electronic device 100 is desired. For example, the electronic device 100 may form part of a mission-critical system, such as an electronic system of an autonomous vehicle (e.g., a navigation system), an industrial system (e.g., robotic control), a flight system, or other device, component, or system for which in-field validation of proper operation is desired.

The compute circuitry 102 may be embodied as any type of circuitry or collection of electronic components for performing various functions. The particular functions performed by the compute circuitry 102 may depend on the type of electronic device 100. Illustratively, the compute circuitry 102 includes the memory wrapper 104, but may include additional electronic devices, components, and/or circuitry in other embodiments depending on the particular functions to be performed by the compute circuitry 102. For example, the compute circuitry 102 may further include a processor 106 and various other peripheral circuits and/or devices 108. In some embodiments, the various electronic devices and/or circuitry of the compute circuitry 102 may be embodied together into a single device or package such as an integrated circuit, an embedded system, a system-on-a-chip (SOC), a field-programmable-array (FPGA), and application specific integrated circuit (ASIC), or similar singular electronic component.

The memory wrapper 104 is embodied as a collection of memory-related devices, components, and/or circuitry configured to store data and verify proper operation of the corresponding memory. Illustratively, the memory wrapper 104 includes a memory array 120, a built-in self-test (BIST) circuit 130, and an error corrector circuit 140. In some embodiments, the various components of the memory wrapper 104 may be discrete electronic devices and/or circuits. However, in other embodiments, the various components of the memory wrapper 104 may be embodied together into a single device or package.

In use, as described in more detail below, the BIST circuit 130 is configured to responsively or periodically verify the proper operation of the memory array 120. To do so, the BIST circuit 130 generates pseudo random data and writes the pseudo random data to the memory array 120. The BIST circuit 130 subsequently reads the written pseudo random data from the memory array 120 and compares the read data to the written data to identify data errors between the two sets of data. Each data error is indicative of a memory fault of the memory array 120, and the BIST circuit 130 generates an error report identifying those memory faults. However, unlike typical BIST circuits, the BIST circuit 130 generates the error report based on an error correction capability of the memory wrapper 104. That is, the BIST circuit 130 utilizes the knowledge that the memory wrapper is capable of correcting at least some of the data errors to generate the error report. In doing so, the BIST circuit 130 may ignore those data errors and corresponding memory faults that are correctable by the error corrector circuit 140 as discussed in more detail below.

The memory array 120 may be embodied as any type of volatile (e.g., dynamic random access memory, etc.) or non-volatile memory (e.g., byte addressable memory) or data storage capable of performing the functions described herein. Volatile memory may be a storage medium that requires power to maintain the state of data stored by the medium. Non-limiting examples of volatile memory may include various types of random access memory (RAM), such as DRAM or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In some embodiments, the memory array 120 may be embodied as a block addressable memory device, such as those based on NAND or NOR technologies. For example, the memory array 120 may be embodied as a three dimensional crosspoint memory device (e.g., Intel 3D XPoint™ memory), or other byte addressable write-in-place nonvolatile memory devices. Additionally or alternatively, in some embodiments, the memory array 120 may be embodied as or otherwise include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory array 120 (and the memory wrapper 104) may refer to the die itself and/or to a packaged memory product. In some embodiments, 3D crosspoint memory (e.g., Intel 3D XPoint™ memory) may comprise a transistor-less stackable cross point architecture in which memory cells sit at the intersection of word lines and bit lines and are individually addressable and in which bit storage is based on a change in bulk resistance.

The BIST circuit 130 may be embodied as any type of circuit or collection of circuits and/or electronic devices capable of verifying the proper operation of the memory array 120 and performing the functions described herein. For example, the BIST circuit 130 may be embodied as a controller, microcontroller, processor, processor core, specialized processor or controller, control circuitry, and/or specialized instructions executable by such components. In some embodiments, the BIST circuit 130 may be embodied as discrete circuits or electronic components. However, in other embodiments, the BIST circuit 130 may be incorporated into other components of the compute circuitry 102 such as the memory array 120 or the processor 106.

The error corrector circuit 140 may be embodied as any type circuitry and/or electronic components capable of detecting and, to some degree, correcting data errors of the memory array 120. In use, the error corrector circuit 140 is configured to generate error check data based on the pseudo random data generated by the BIST circuit 130 and utilize the error check data to identify any data errors in the data read back from the memory array 120. Additionally, the error corrector circuit 140 is configured to attempt to correct one or more of the data errors using the error check data. Depending on the particular type of electronic device 100, compute circuitry 102, and/or memory wrapper 104, the error corrector circuit 140 may be embodied as various types of data error correction circuitry/devices. For example, in an illustrative embodiments, the error corrector circuit 140 is embodied as an Error Correction Code (ECC) circuit and may include an ECC encoder and ECC decoder. In such embodiments, the ECC encoder is configured to generate ECC codes based on the random data generated by the BIST circuit 130 and store the pseudo random data and the ECC codes, in association with each other, in the memory array 120. The ECC decoder is configured to read the stored data and verify the accuracy of the read data using the ECC codes. Additionally, the ECC decoder attempts to correct one or more identified errors in the read data using the ECC codes. Of course, the error corrector circuit 140 may be embodied as other types of error correction devices and/or circuits and/or use other forms of error correction in other embodiments including, but not limited to, parity correction devices and algorithms, forward error correction (FEC) devices and algorithms, redundant data devices and algorithms, checksums devices and algorithms, cyclic redundancy checks (CRCs) devices and algorithms, cryptographic hash devices and algorithms, and/or other data error detection and correction devices, circuits, and associated methodologies.

The processor 106 may be embodied as any type of processor capable of performing various compute and/or control functions. For example, the processor 106 may be embodied as a single or multi-core processor(s), digital signal processor, microcontroller, or other processor or processing/controlling circuit. The peripheral circuits and/or devices 108 may be embodied as any type of additional circuits, electronic components, and/or devices included in the electronic device 100 including, but not limited to, input/output devices, additional storage devices, accelerator devices, and/or other electrical circuits and/or devices depending on, for example, the particular type of electronic device 100 and its associated functionality.

Figure 2:
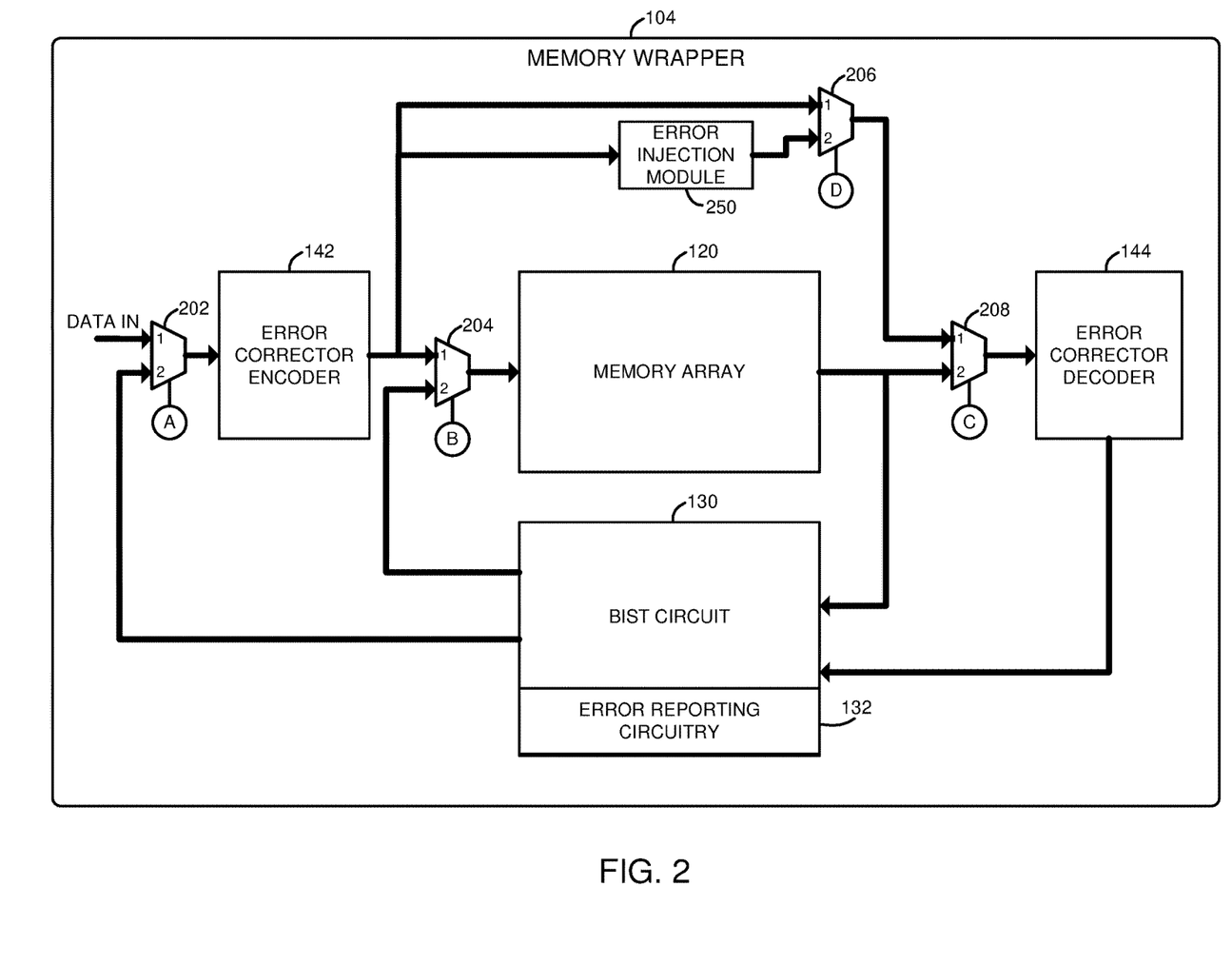
FIG. 2 is a simplified block diagram of at least one embodiment of a memory wrapper of the electronic device of FIG. 1.

Referring now to FIG. 2, an illustrative architecture of the memory wrapper 104 includes the memory array 120, the BIST circuit 130, and the error corrector circuit 140 which is embodied as an error corrector encoder 142 and an error corrector decoder 144. Illustratively, the error corrector encoder 142 is embodied as an ECC encoder and the error corrector decoder 144 is embodied as an ECC decoder. However, other types of error correction encoders and decoders may be used in other embodiments as discussed above. The illustrative memory wrapper 104 also include an error injection module 250, which is configured to inject an error into the pseudo random data generated by the BIST circuit 130 in some operation modes of the BIST circuit 130 as discussed above.

It should be appreciated that the memory wrapper 104 may be operated in one of several different operation modes depending on the desired functionality of the memory wrapper 104. For example, the memory wrapper may be operated in a functional mode during normal operation, but switched to a test mode when it is desired to test for faults in the memory array 120. To facilitate changing of the operation modes, the memory wrapper 104 includes several switches or multiplexers 202, 204, 206, 208, which may be controlled or switched to control the flow of data traffic within the memory wrapper 104. For example, the switch 202 may be controlled to switch between a first input to receive data from other components (e.g., the processor 106) of the compute circuitry 102 or a second input to receive the pseudo random data from the BIST circuit 130 as discussed below. Similarly, the switch 204 may be controlled to switch between a first input to receive an output of the error corrector encoder 142 or a second input to receive the pseudo random data from the BIST circuit 130. The switch 206 may be switched between a first input to receive the output of the error corrector encoder 142 and a second input to receive the output of the error injection module 250. And, the switch 208 may be switched between a first input to receive the output of the switch 206 or a second output to receive data read from the memory array 120.

Figure 3:
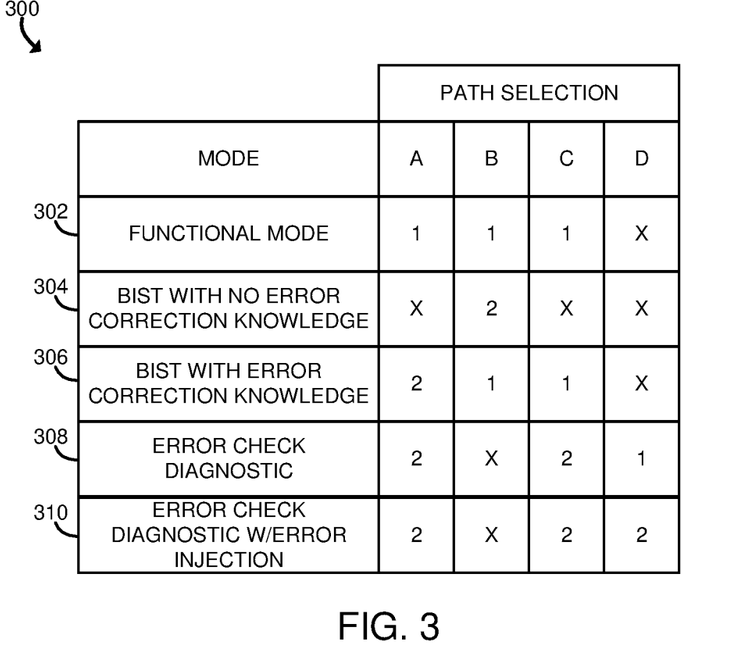
FIG. 3 is a simplified chart illustrating various test modes of the memory wrapper of the electronic device of FIG. 1.

Several illustrative operation modes and the corresponding settings of the switches 202, 204, 206, 208 are shown in table 300 of FIG. 3. For example, the memory wrapper 104 may be configured in a functional mode 302 during normal operation. In the functional mode 302, the switch 202 is controlled to select the first input to receive data from other components of the compute circuitry 102. Such data may, for example, be provided to the memory wrapper 104 to be stored in the memory array 120. The input data is provided to the error corrector encoder, which generates the error check data (e.g., ECC data) and stores the input data and the corresponding error check data in the memory array 120 through the switch 204, which is controlled to select the first input to receive the output of the error corrector encoder 142. The stored data may be subsequently read from the memory array 120 during normal operation and is provided to the error corrector decoder 144 through the switch 208, which is controlled to select the second input to receive the output of the memory array 120. The error corrector decoder 144 may identify any data error with the read data and attempt to correct one or more data errors using the retrieved error check data (e.g., the saved ECC data).

The memory wrapper 104 may also be configured in a built-in self-test with no error correction knowledge mode 304. The mode 304 is a similar mode to standard BIST circuits. In the mode 304, the switches 202, 206, and 208 are not used. However, switch 204 is controlled to the second input to allow the BIST circuit 130 to write the generated pseudo random data directly to the memory array 120. The BIST circuit 130 may then read the written data via the output line of the memory array 120 and compare the read data to the written data to identify data errors and corresponding memory faults. If a memory fault is detected, an error reporting circuitry 132 of the BIST circuit 130 may generate an error report identifying the faulty memory and/or faulty memory locations or chucks.

Alternatively, the memory wrapper 104 may be configured in a built-in self-test with error correction knowledge mode 306. In the mode 306, the switch 206 is not used. However, the switch 202 is controlled to select the second input to receive the generated pseudo random data from the BIST circuit 130, which is provided to the error corrector encoder 142. The error corrector encoder 142 generates the error check data (e.g., ECC data) and stores the pseudo random data and the corresponding error check data in the memory array 120 through the switch 204, which is controlled to select the first input to receive the output of the error corrector encoder 142. The data written to the memory is subsequently read out by the BIST circuit 130 via the output lines as well as by the error corrector decoder via the switch 208, which is controlled to select the second input to receive the output of the memory array 120. The BIST circuit 130 analyzes the read data from the memory array 120 and compares it to the written pseudo random data to identify any data errors, which are indicative of corresponding memory faults (i.e., the memory faults may be on a per-bit level or a per-chuck (e.g., a per memory line) level). Additionally, the error corrector decoder 144 identifies any data errors in the read data from the memory array 120 and attempts to correct one or more data errors using the retrieved error check data (e.g., the saved ECC data). The error corrector decoder 144 generates error information indicative of the data errors and those data errors that were corrected (or are otherwise correctable) and provide that error information to the BIST circuit 130. The BIST circuit 130 utilizes the error information received from the error corrector decoder 144 to identify those identified data errors of the read data from the memory wrapper 104 that correctable. The BIST circuit 130 subsequently generates an error report identifying the faulty memory and/or faulty memory locations or chucks. In doing so, however, the BIST circuit 130 ignores (or take notice and continue with the subsequent testing without halting) those memory faults corresponding to data errors that are correctable by the error corrector decoder 144.

The memory wrapper 104 may also be configured in an error check diagnostic mode 308 useable to verify proper operation of the error corrector encoder 142 and the error corrector decoder 144. In mode 308, the switch 204 is not used. However, the switch 202 is controlled to the select the second input to receive the generated pseudo random data from the BIST circuit 130, which is provided to the error corrector encoder 142. The error corrector encoder 142 generates the error check data (e.g., ECC data) and provides the pseudo random data generated by the BIST circuit 130 and the error check data to the switch 206. The switch 206 is controlled to select the first input to receive the pseudo random data and the error check data from the error corrector encoder 142, which is provided to the first input of the switch 208. The switch 208 is controlled to select the first input to further provide the pseudo random data and the error check data to the error corrector decoder 144. The error corrector decoder 144 detects any data errors with the received random data using the error check data and generates the error information identifying any detected errors. The error corrector decoder 144 subsequently provides the error information to the BIST circuit 130, which verifies that no data errors have been detected. That is, because the pseudo random data generated by the BIST circuit 130 is not stored in the memory array 120, the pseudo random data received by the error corrector decoder should not obtain any errors unless those errors were introduced by the error corrector encoder 142 or error corrector decoder 144. In this way, the BIST circuit 130 can verify that the error corrector encoder 142 and error corrector decoder 144 are not injecting errors into the data themselves.

Additionally, the memory wrapper 104 may be configured in an error check diagnostic with error injection mode 310 usable verify the error correction capability of the error corrector encoder 142 and the error corrector decoder 144. In mode 310, the switch 204 is not used. However, the switch 202 is controlled to select the first input to select the second input to receive the generated pseudo random data from the BIST circuit 130, which is provided to the error corrector encoder 142. The error corrector encoder 142 generates the error check data (e.g., ECC data) and provides the pseudo random data generated by the BIST circuit 130 and the error check data to the error injection module 250, which is configured to inject one or more errors into the pseudo random data. To do so, the error injection module 250 may utilize any suitable methodology to generate the data errors to be injected into the pseudo random data (e.g., by randomly flipping bits, XORing data, etc.). The error injection module 250 provides the pseudo random data including the injected errors and the error check data to the switch 206, which is controlled to select the second input. As such, the pseudo random data including the injected errors and the error check data is further provided to the switch 208, which is controlled to select the first input to further provide the pseudo random data including the injected errors and the error check data to the error corrector decoder 144. The error corrector decoder 144 performs its error detection and identifies the errors in the pseudo random data using the error check data. The error corrector decoder 144 generates the error information, which identifies the detected errors, and subsequently provides the error information to the BIST circuit 130. The BIST circuit 130 verifies that the error information has successfully identified the data errors and, in some cases, successfully corrected those errors. In this way, the BIST circuit 130 can verify that the error corrector encoder 142 and error corrector decoder 144 are capable of detecting and correcting, as per the capability of the error corrector encoder 142 and decoder 144, errors in the read data from the memory array 120.

Figure 4:
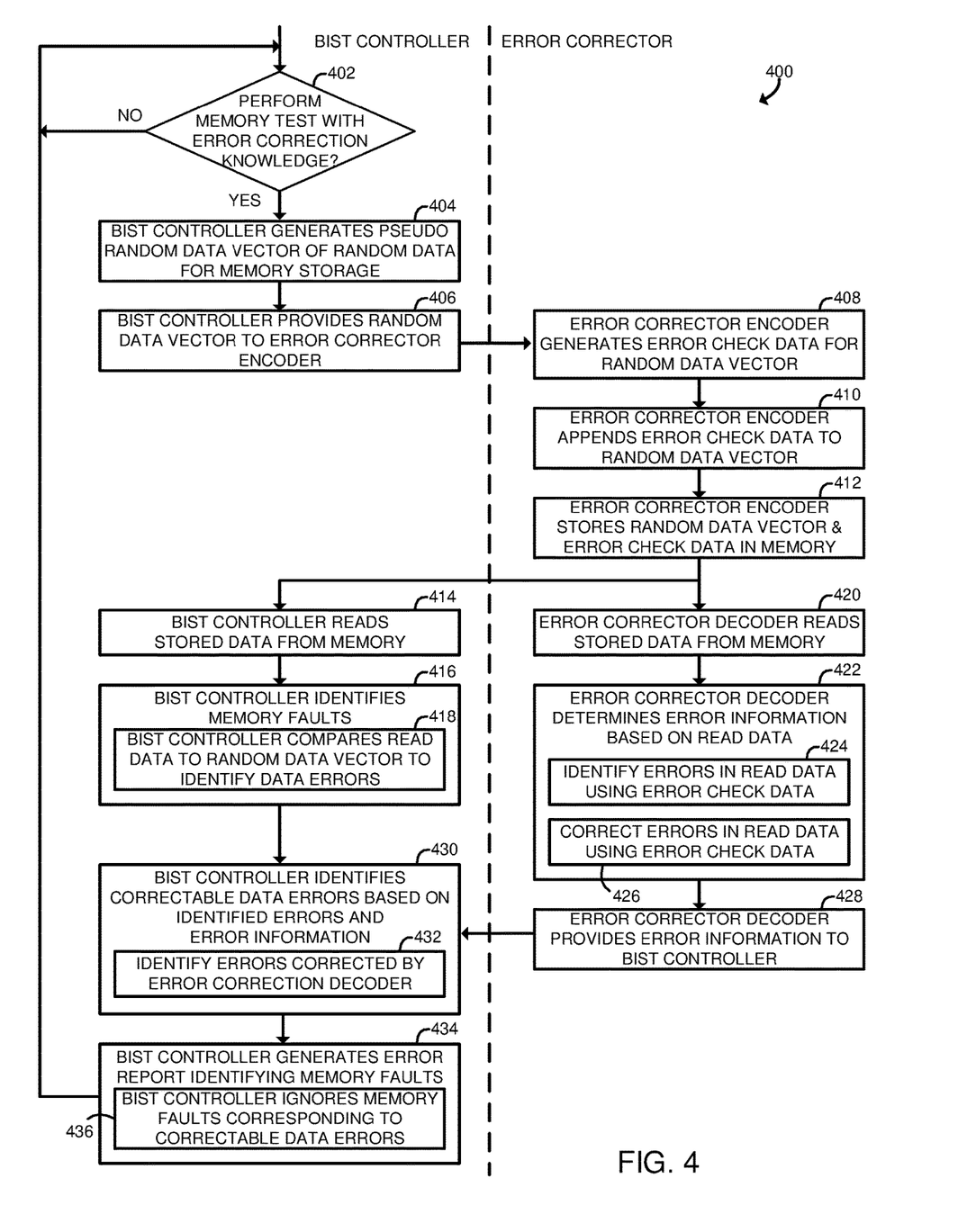
FIG. 4 is a simplified flow diagram of at least one embodiment of a method for performing a memory test with error correction knowledge, which may be performed by the memory wrapper of FIG. 2.

Referring now to FIG. 4, in use, the memory wrapper 104 may perform a method 400 for performing a memory test with error correction knowledge. The method 400 begins with block 402 in which the BIST circuit 130 determines whether to perform a memory test with error correction knowledge. If so, the method 400 advances to block 404 in which the BIST circuit 130 generates a pseudo random data vector for storage in the memory array 120. To do so, the BIST circuit 130 may utilize any suitable methodology to generate the pseudo random data vector. As such, the pseudo random data vector may be embodied as any type of random data or data structure capable of being stored in the memory array 120. Once generated, the BIST circuit 130 provides the pseudo random data vector to the error corrector encoder via the switch 202 in block 406.

In block 408, the error corrector encoder 142 generates the error check data (e.g., ECC data) based on the pseudo random data vector received from the BIST circuit 130. In block 410, the error corrector encoder 142 appends the error check data to the pseudo random data vector and stores the pseudo random data vector and the error check data in the memory array 120 in association with each other at the same address location in the memory array.

Subsequently in block 414, the BIST circuit 130 reads the stored pseudo random data vector from the memory array 120. The BIST circuit 130 initially identifies memory faults of the memory array 120 in block 416 based on the read pseudo random data. To do so, in block 418, the BIST circuit 130 compares the pseudo random data vector read from the memory array 120 to the pseudo random data vector written to the memory array 120 to identify any difference between the two data sets. Any identified differences are indicative of a data error of the read data, and the BIST circuit 130 identifies a memory fault for the corresponding memory location (e.g., a memory row or chuck).

In block 420, the error corrector decoder 144 also reads the stored pseudo random data vector and error check data from the memory array 120. The error corrector decoder 144 determines error information based on the pseudo random data and error check data read form the memory array 120. To do so, the error corrector decoder 144 identifies errors in the read random data using the error check data. For example, in embodiments in which the error corrector decoder 144 is embodied as an ECC decoder, the ECC decoder identifies errors in the read pseudo random data using the corresponding ECC codes. Additionally in block 426, the error corrector decoder 144 attempts to correct one or more errors in the read pseudo random data using the error check data (e.g., ECC codes). Subsequently, in block 428, the error corrector decoder 144 generates error information identifying any errors in the read random data, as well as those errors that have been corrected or are otherwise correctable and provides the error information to the BIST circuit 130.

In block 430, the BIST circuit 130 identifies those data errors of the read pseudo random data that are correctable based on the identified data errors and the error information. To do so, in block 432, the BIST circuit 130 may identify those errors indicated as corrected or otherwise correctable in the error information received from the error corrector decoder 144. The BIST circuit 130 subsequently generates an error report that identifies memory faults of the memory array 120 based on the identified data errors of the read pseudo random data. The memory faults may be defined as locations of the memory array 120 that produced the data errors, and such memory locations may be defined in any suitable level of granularity (e.g., on a per bit basis, on a per line basis, on a per block basis, or other memory chuck basis). However, in generating the error report, the BIST circuit 130 ignores (or take notice and continue with the subsequent testing without halting) those memory faults corresponding to data errors that were corrected by the error corrector decoder 144 or otherwise indicated as correctable in the error information provided by the error corrector decoder 144 in block 436. In this way, the BIST circuit 130 identifies only those memory faults of the memory array 120 that are uncorrectable by the error corrector decoder 144. As such, the electronic device 100 may continue use of the memory array 120 and avoid unnecessary early repair or replacement of the memory array 120 and/or unnecessary failure of the electronic device 100 during functional safety mode.

Figure 5:
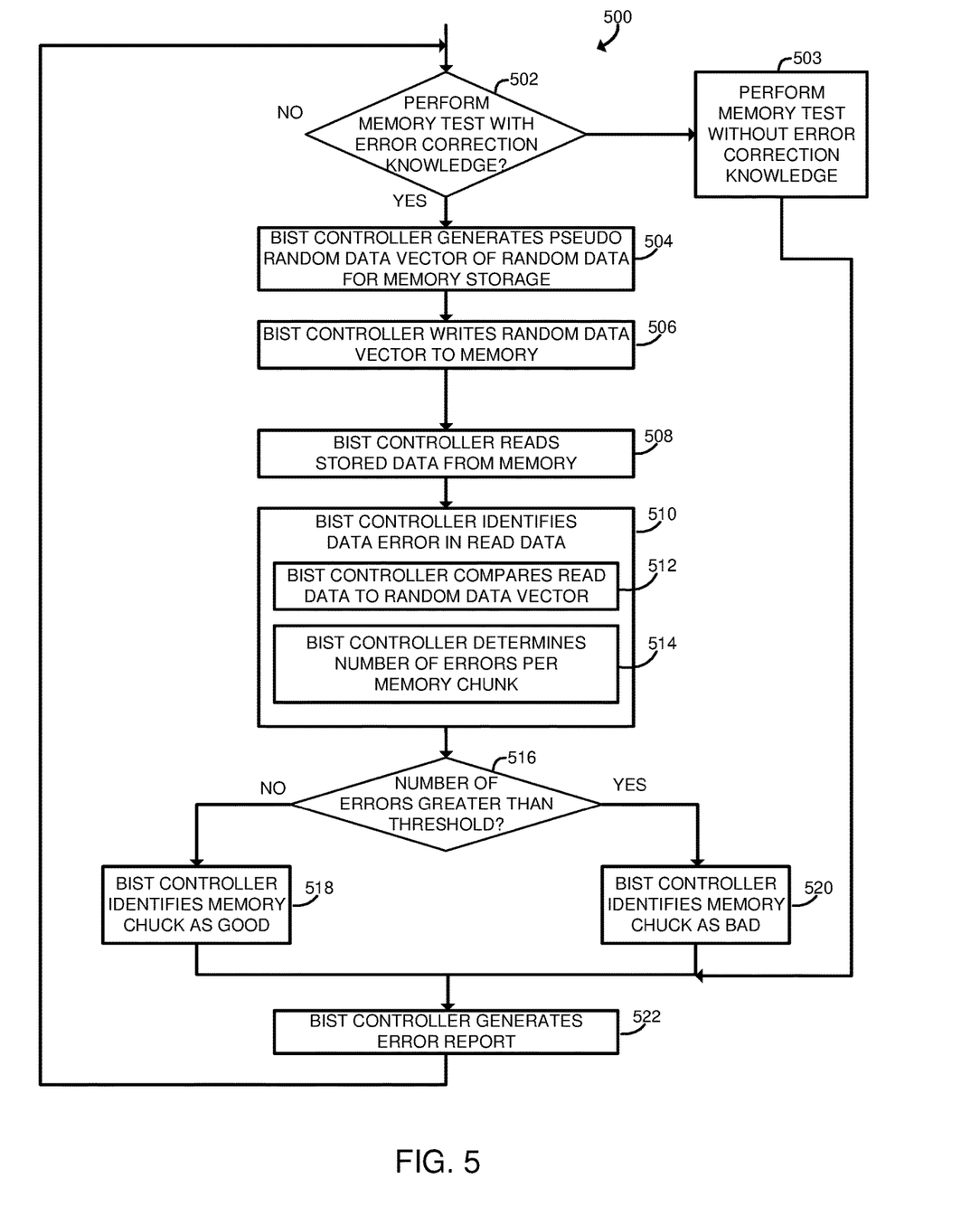
FIG. 5 is simplified flow diagram of at least another embodiment of a method for performing a memory test with error correction knowledge, which may be performed by the BIST circuit of the memory wrapper of FIG. 2.

Referring now to FIG. 5, in some embodiments, the memory wrapper 104 may perform another method 500 for performing a memory test with error correction knowledge. In the method 500 the error corrector encoder 142 and error corrector decoder 144 are not used in the test and may or may not be present in the memory wrapper 104. The method 500 begins with block 502 in which the BIST circuit 130 determines whether to perform a memory test with error correction knowledge. If not, the BIST circuit 130 perform the memory test without error correction knowledge in block 503, and the method 500 advances to block 522 in which the BIST circuit 130 generates an error report identifying any memory faults of the memory array 120. If, however, the BIST circuit 130 determines to perform a memory test with error correction knowledge, the method 500 advances to block 504 in which the BIST circuit 130 generates a pseudo random data vector for storage in the memory array 120. As discussed above, the BIST circuit 130 may utilize any suitable methodology to generate the pseudo random data vector. Once generated, the BIST circuit 130 stores the pseudo random data vector in the memory array 120 in block 506.

Subsequently, in block 508, the BIST circuit 130 reads the stored pseudo random data vector from the memory array 120. In block 510, the BIST circuit 130 identifies any data errors in the read pseudo random data. To do so, in block 512, the BIST controller compares the pseudo random data vector read from the memory array 120 to the pseudo random data vector written to the memory array 120 to identify any difference between the two data sets. Any identified differences are indicative of a data error of the read data. In block 514, the BIST circuit 130 determines the number of identified data errors in the read data and determines whether that number is greater than a predefined threshold number of correctable errors which can be a knowledge provided to the BIST circuit 130 through various mechanisms. That is, the BIST circuit 130 compares the number of identified data errors to a maximum number of errors that are correctable by the error corrector encoder 142 and error corrector decoder 144. The maximum number of errors correctable by the error corrector encoder 142 and error corrector decoder 144 may, of course, depend on the type of error correction coding choice used by the encoder 142/decoder 144. As such, in some embodiments, a theoretical or estimated maximum number of correctable errors may be used.

If the number of identified errors is not greater than the predefined threshold number of correctable errors which can be a knowledge provided to the BIST controller through various mechanisms, the method 500 advances to block 518 in which the BIST circuit 130 identifies that particular memory chuck (e.g., memory bit, line, block, etc.) associated with the identified data errors to be good. However, if the number of identified errors is greater than the predefined threshold number of correctable errors which can be a knowledge provided to the BIST controller through various mechanisms, the method 500 advances to block 520 in which the BIST circuit 130 identifies the corresponding memory chuck as bad. In either case, the method 500 advances to block 522 in which the BIST circuit 130 generates the error report identifying any memory faults of the memory array 120 based on the memory chucks identified as bad.

EXAMPLES

Illustrative examples of the technologies disclosed herein are provided below. An embodiment of the technologies may include any one or more, and any combination of, the examples described below.

Example 1 includes memory wrapper of an electronic circuitry. The memory wrapper comprises a memory array to store data; and a built-in self-test (BIST) circuit to generate pseudo random data; cause the pseudo random data to be written to the memory array as written data; read the written data from the memory array as read data; compare the written data and the read data to determine one or more memory faults of the memory array; and generate an error report identifying the one or more memory faults, wherein to generate the error report comprises to ignore at least one memory fault based on a knowledge of an error detection and correction capability of the memory wrapper.

Example 2 includes the subject matter of Example 1, and further comprising an error corrector encoder and an error corrector decoder.

Example 3 includes the subject matter of Example 1 or 2, and wherein the error corrector encoder comprises an ECC encoder and the error corrector decoder comprises an ECC decoder.

Example 4 includes the subject matter of any of Examples 1-3, and wherein to cause the pseudo random data to be written to the memory array comprises to provide the pseudo random data to the error corrector encoder, wherein the error corrector encoder is to generate error check data based on the pseudo random data an write the pseudo random data and the error check data to the memory array as the written data, wherein the error check data is usable to determine an accuracy of the pseudo random data when read from the memory array.

Example 5 includes the subject matter of any of Examples 1-4, and wherein the error corrector decoder is to receive the written data on a read path from the memory array as the read data, identify one or more data errors of the pseudo random data of the read data based on the error check data of the read data, and correct at least one data error using the error check data of the read data.

Example 6 includes the subject matter of any of Examples 1-5, and wherein the error corrector decoder is further to generate error information indicative of the one or more data errors and the at least one data error corrected by the error corrector decoder, wherein the BIST controller is to ignore the at least one memory fault based on the error information received from the error corrector decoder.

Example 7 includes the subject matter of any of Examples 1-6, and wherein to ignore the at least one memory fault comprises to ignore those memory faults corresponding to data errors of the error information that have been corrected by the error corrector decoder.

Example 8 includes the subject matter of any of Examples 1-7, and wherein to compare the written data and the read data comprises to determine a number of data errors between the written data and the read data for one or more memory chucks, wherein each memory chuck is a reference amount of memory and each memory fault corresponds to a memory chuck of the one or more memory chucks having at least one data error included therein, and wherein to generate the error report comprises to ignore those memory faults having a number of data errors included therein less than a threshold number.

Example 9 includes the subject matter of any of Examples 1-8, and wherein the threshold number is defined by a number of errors correctable by an error corrector decoder of the memory wrapper.

Example 10 includes a method for testing a memory array of a memory wrapper. The method includes generating, by a built-in self-test (BIST) circuit of the memory wrapper, pseudo random data; causing, by the BIST circuit, the pseudo random data to be written to the memory array as written data; reading, by the BIST circuit, the written data from the memory array as read data; comparing, by the BIST circuit, the written data and the read data to determine one or more memory faults of the memory array; and generating, by the BIST circuit, an error report identifying the one or more memory faults, wherein generating the error report comprises ignoring at least one memory fault based on an error correction capability of the memory wrapper.

Example 11 includes the subject matter of Examples 9 or 10, and wherein causing the pseudo random data to be written to the memory array comprises providing, by the BIST circuity, the pseudo random data to an error corrector encoder of the memory wrapper, and further comprising (i) generating, by the error corrector encoder, error check data based on the pseudo random data and (ii) writing, by the error corrector encoder, the pseudo random data and the error check data to the memory array as the written data, wherein the error check data is usable to determine an accuracy of the pseudo random data when read from the memory array.

Example 12 includes the subject matter of any of Examples 9-11, and further comprising reading, by the error corrector decoder, the written data from the memory array as the read data; identifying, by the error corrector decoder, one or more data errors of the pseudo random data of the read data based on the error check data of the read data; and correcting, by the error corrector decoder, at least one data error using the error check data of the read data.

Example 13 includes the subject matter of any of Examples 9-12, and further comprising generating, by the error corrector decoder, error information indicative of the one or more data errors and the at least one data error corrected by the error corrector decoder, wherein ignoring the at least one memory fault comprises ignoring at least one memory fault based on the error information received from the error corrector decoder.

Example 14 includes the subject matter of any of Examples 9-13, and wherein ignoring the at least one memory fault comprises ignoring those memory faults corresponding to data errors of the error information that have been corrected by the error corrector decoder.

Example 15 includes the subject matter of any of Examples 9-14, and wherein comparing the written data and the read data comprises determining, by the BIST circuit, a number of data errors between the written data and the read data for one or more memory chucks, wherein each memory chuck is a reference amount of memory and each memory fault corresponds to a memory chuck of the one or more memory chucks having at least one data error included therein, and wherein generating the error report comprises ignoring those memory faults having a number of data errors included therein less than a threshold number.

Example 16 includes the subject matter of any of Examples 9-15, and wherein the threshold number is defined by a number of errors correctable by an error corrector decoder of the memory wrapper.

Example 17 includes one or more machine-readable storage media comprising a plurality of instructions stored thereon that, when executed, cause a built-in self-test (BIST) circuit of a memory wrapper to generate pseudo random data; cause the pseudo random data to be written to the memory array as written data; read the written data from the memory array as read data; compare the written data and the read data to determine one or more memory faults of the memory array; and generate an error report identifying the one or more memory faults, wherein to generate the error report comprises to ignore at least one memory fault based on an error correction capability of the memory wrapper.

Example 18 includes the subject matter of Example 17, and wherein to cause the pseudo random data to be written to the memory array comprises to provide the pseudo random data to an error corrector encoder of the memory wrapper, and wherein the plurality of instructions, when executed, further cause the error corrector encoder to generate error check data based on the pseudo random data and the pseudo random data and the error check data to the memory array are written as the written data, wherein the error check data is usable to determine an accuracy of the pseudo random data when read from the memory array.

Example 19 includes the subject matter of Example 17 or 18, and wherein the plurality of instructions, when executed, further cause an error corrector decoder of the memory wrapper to read the written data from the memory array as the read data; identify one or more data errors of the pseudo random data of the read data based on the error check data of the read data; and correct at least one data error using the error check data of the read data.

Example 20 includes the subject matter of any of Examples 17-19, and wherein the plurality of instructions, when executed, further cause an error corrector decoder of the memory wrapper to generate error information indicative of the one or more data errors and the at least one data error corrected by the error corrector decoder, wherein to ignore the at least one memory fault comprises to ignore at least one memory fault based on the error information received from the error corrector decoder.

Example 21 includes the subject matter of any of Examples 17-20, and wherein to ignore the at least one memory fault comprises to ignore those memory faults corresponding to data errors of the error information that have been corrected by the error corrector decoder.

Example 22 includes the subject matter of any of Examples 17-21, and wherein to compare the written data and the read data comprises to determine a number of data errors between the written data and the read data for one or more memory chucks, wherein each memory chuck is a reference amount of memory and each memory fault corresponds to a memory chuck of the one or more memory chucks having at least one data error included therein, and wherein to generate the error report comprises to ignore those memory faults having a number of data errors included therein less than a threshold number.

Example 23 includes the subject matter of any of Examples 17-22, and wherein the threshold number is defined by a number of errors correctable by an error corrector decoder of the memory wrapper.

The invention claimed is:

1. A memory wrapper of an electronic circuitry, the memory wrapper comprising:
   a memory array to store data; and
   a built-in self-test (BIST) circuit to
      generate pseudo random data;
      cause the pseudo random data to be written to the memory array as written data;
      read the written data from the memory array as read data;
      compare the written data and the read data to determine one or more memory faults of the memory array; and
      generate an error report identifying the one or more memory faults, wherein to generate the error report comprises to ignore at least one memory fault based on a determination that the at least one memory fault is correctable by an error correction capability of the memory wrapper.

2. The memory wrapper of claim 1, further comprising an error corrector encoder and an error corrector decoder.

3. The memory wrapper of claim 2, wherein the error corrector encoder comprises an ECC encoder and the error corrector decoder comprises an ECC decoder.

4. The memory wrapper of claim 2, wherein to cause the pseudo random data to be written to the memory array comprises to provide the pseudo random data to the error corrector encoder,
   wherein the error corrector encoder is to generate error check data based on the pseudo random data and write the pseudo random data and the error check data to the memory array as the written data, wherein the error check data is usable to determine an accuracy of the pseudo random data when read from the memory array.

5. The memory wrapper of claim 4, wherein the error corrector decoder is to receive the written data on a read path from the memory array as the read data, identify one or more data errors of the pseudo random data of the read data based on the error check data of the read data, and correct at least one data error using the error check data of the read data.

6. The memory wrapper of claim 5, wherein the error corrector decoder is further to generate error information indicative of the one or more data errors and the at least one data error corrected by the error corrector decoder,
   wherein the BIST controller is to ignore the at least one memory fault based on the error information received from the error corrector decoder.

7. The memory wrapper of claim 6, wherein to ignore the at least one memory fault comprises to ignore those memory faults corresponding to data errors of the error information that have been corrected by the error corrector decoder.

8. The memory wrapper of claim 1, wherein to compare the written data and the read data comprises to determine a number of data errors between the written data and the read data for one or more memory chucks, wherein each memory chuck is a reference amount of memory and each memory fault corresponds to a memory chuck of the one or more memory chucks having at least one data error included therein, and
   wherein to generate the error report comprises to ignore those memory faults having a number of data errors included therein less than a threshold number.

9. The memory wrapper of claim 8, wherein the threshold number is defined by a number of errors correctable by an error corrector decoder of the memory wrapper.

10. A method for testing a memory array of a memory wrapper, the method comprising:
    generating, by a built-in self-test (BIST) circuit of the memory wrapper, pseudo random data;
    causing, by the BIST circuit, the pseudo random data to be written to the memory array as written data;
    reading, by the BIST circuit, the written data from the memory array as read data;
    comparing, by the BIST circuit, the written data and the read data to determine one or more memory faults of the memory array; and
    generating, by the BIST circuit, an error report identifying the one or more memory faults, wherein generating the error report comprises ignoring at least one memory fault based on a determination that the at least one memory fault is correctable by an error correction capability of the memory wrapper.

11. The method of claim 10, wherein causing the pseudo random data to be written to the memory array comprises providing, by the BIST circuitry, the pseudo random data to an error corrector encoder of the memory wrapper, and
    further comprising (i) generating, by the error corrector encoder, error check data based on the pseudo random data and (ii) writing, by the error corrector encoder, the pseudo random data and the error check data to the memory array as the written data, wherein the error check data is usable to determine an accuracy of the pseudo random data when read from the memory array.

12. The method of claim 11, further comprising:
    reading, by the error corrector decoder, the written data from the memory array as the read data;
    identifying, by the error corrector decoder, one or more data errors of the pseudo random data of the read data based on the error check data of the read data; and
    correcting, by the error corrector decoder, at least one data error using the error check data of the read data.

13. The method of claim 12, further comprising generating, by the error corrector decoder, error information indicative of the one or more data errors and the at least one data error corrected by the error corrector decoder,
    wherein ignoring the at least one memory fault comprises ignoring at least one memory fault based on the error information received from the error corrector decoder.

14. The method of claim 13, wherein ignoring the at least one memory fault comprises ignoring those memory faults corresponding to data errors of the error information that have been corrected by the error corrector decoder.

15. The method of claim 10, wherein comparing the written data and the read data comprises determining, by the BIST circuit, a number of data errors between the written data and the read data for one or more memory chucks, wherein each memory chuck is a reference amount of memory and each memory fault corresponds to a memory chuck of the one or more memory chucks having at least one data error included therein, and
    wherein generating the error report comprises ignoring those memory faults having a number of data errors included therein less than a threshold number.

16. The method of claim 15, wherein the threshold number is defined by a number of errors correctable by an error corrector decoder of the memory wrapper.

17. One or more machine-readable storage media comprising a plurality of instructions stored thereon that, when executed, cause a built-in self-test (BIST) circuit of a memory wrapper to:
generate pseudo random data;
cause the pseudo random data to be written to the memory array as written data;
read the written data from the memory array as read data;
compare the written data and the read data to determine one or more memory faults of the memory array; and
generate an error report identifying the one or more memory faults, wherein to generate the error report comprises to ignore at least one memory fault based on a determination that the at least one memory fault is correctable by an error correction capability of the memory wrapper.

18. The one or more machine-readable storage media of claim 17, wherein to cause the pseudo random data to be written to the memory array comprises to provide the pseudo random data to an error corrector encoder of the memory wrapper, and
wherein the plurality of instructions, when executed, further cause the error corrector encoder to generate error check data based on the pseudo random data and the pseudo random data and the error check data to the memory array are written as the written data, wherein the error check data is usable to determine an accuracy of the pseudo random data when read from the memory array.

19. The one or more machine-readable storage media of claim 18, wherein the plurality of instructions, when executed, further cause an error corrector decoder of the memory wrapper to:
read the written data from the memory array as the read data;
identify one or more data errors of the pseudo random data of the read data based on the error check data of the read data; and
correct at least one data error using the error check data of the read data.

20. The one or more machine-readable storage media of claim 19, wherein the plurality of instructions, when executed, further cause an error corrector decoder of the memory wrapper to generate error information indicative of the one or more data errors and the at least one data error corrected by the error corrector decoder,
wherein to ignore the at least one memory fault comprises to ignore at least one memory fault based on the error information received from the error corrector decoder.

21. The one or more machine-readable storage media of claim 20, wherein to ignore the at least one memory fault comprises to ignore those memory faults corresponding to data errors of the error information that have been corrected by the error corrector decoder.

22. The one or more machine-readable storage media of claim 17, wherein to compare the written data and the read data comprises to determine a number of data errors between the written data and the read data for one or more memory chucks, wherein each memory chuck is a reference amount of memory and each memory fault corresponds to a memory chuck of the one or more memory chucks having at least one data error included therein, and
wherein to generate the error report comprises to ignore those memory faults having a number of data errors included therein less than a threshold number.

23. The one or more machine-readable storage media of claim 22, wherein the threshold number is defined by a number of errors correctable by an error corrector decoder of the memory wrapper.

* * * * *